(12) United States Patent
Kim et al.

(10) Patent No.: US 6,879,423 B2
(45) Date of Patent: Apr. 12, 2005

(54) PRINTED CIRCUIT BOARD ASSEMBLY WITH MULTI-CHANNEL BLOCK-TYPE OPTICAL DEVICES PACKAGED THEREIN

(75) Inventors: Young-Woo Kim, Chungcheongnam-do (KR); Young-Sang Cho, Chungcheongbuk-do (KR); Dek-Gin Yang, Chungcheongbuk-do (KR)

(73) Assignee: Samsung Electro-Mechanics Co., LTD, Kyinggi-Do (KR)

( * ) Notice: Subject to any disclaimer, the term of this patent is extended or adjusted under 35 U.S.C. 154(b) by 0 days.

(21) Appl. No.: 10/743,216

(22) Filed: Dec. 22, 2003

(65) Prior Publication Data

US 2004/0136099 A1 Jul. 15, 2004

(30) Foreign Application Priority Data

Dec. 27, 2002 (KR) .............................. 10-2002-0085312

(51) Int. Cl.$^7$ ............................. G02F 1/03; G02B 6/12; H01L 23/48; F16F 3/08; H04B 10/00
(52) U.S. Cl. ..................... 359/245; 359/248; 359/618; 385/14; 385/32; 257/738; 257/778; 267/152; 398/130; 361/760
(58) Field of Search .......................... 398/130; 361/760, 361/764; 359/245, 248, 618; 385/14, 32; 257/99, 723, 738, 778; 267/152, 136

(56) References Cited

U.S. PATENT DOCUMENTS

| | | | | |
|---|---|---|---|---|
| 6,409,159 B1 | * | 6/2002 | Asai et al. | 267/152 |
| 6,414,849 B1 | * | 7/2002 | Chiu | 361/760 |
| 6,754,407 B1 | * | 6/2004 | Chakravorty et al. | 385/14 |
| 2003/0222344 A1 | * | 12/2003 | Hosoyamada et al. | 257/738 |

* cited by examiner

Primary Examiner—Loha Ben
(74) Attorney, Agent, or Firm—Gottlieb, Rackman & Reisman, P.C.

(57) ABSTRACT

The present invention discloses an optical printed circuit board assembly with multi-channel block-type optical devices packaged therein, the printed circuit board assembly including a plate type heat spreader, a driving printed circuit board die bonded to a top of the heat spreader to convert electrical and optical signals to optical and electrical signals, respectively, a driving integrated circuit, die bonded to the top of the heat spreader and wire bonded to the driving printed circuit board.

33 Claims, 18 Drawing Sheets

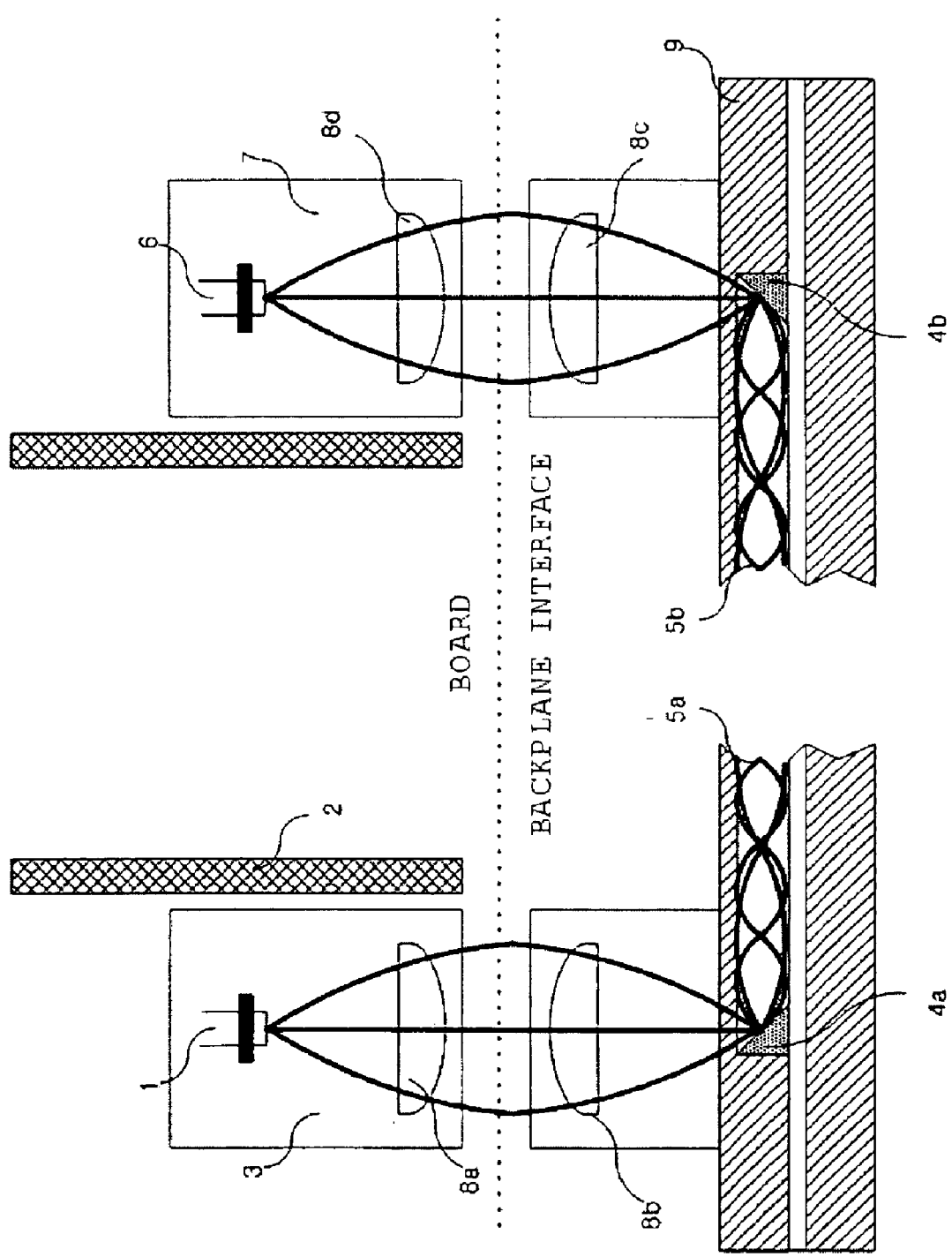

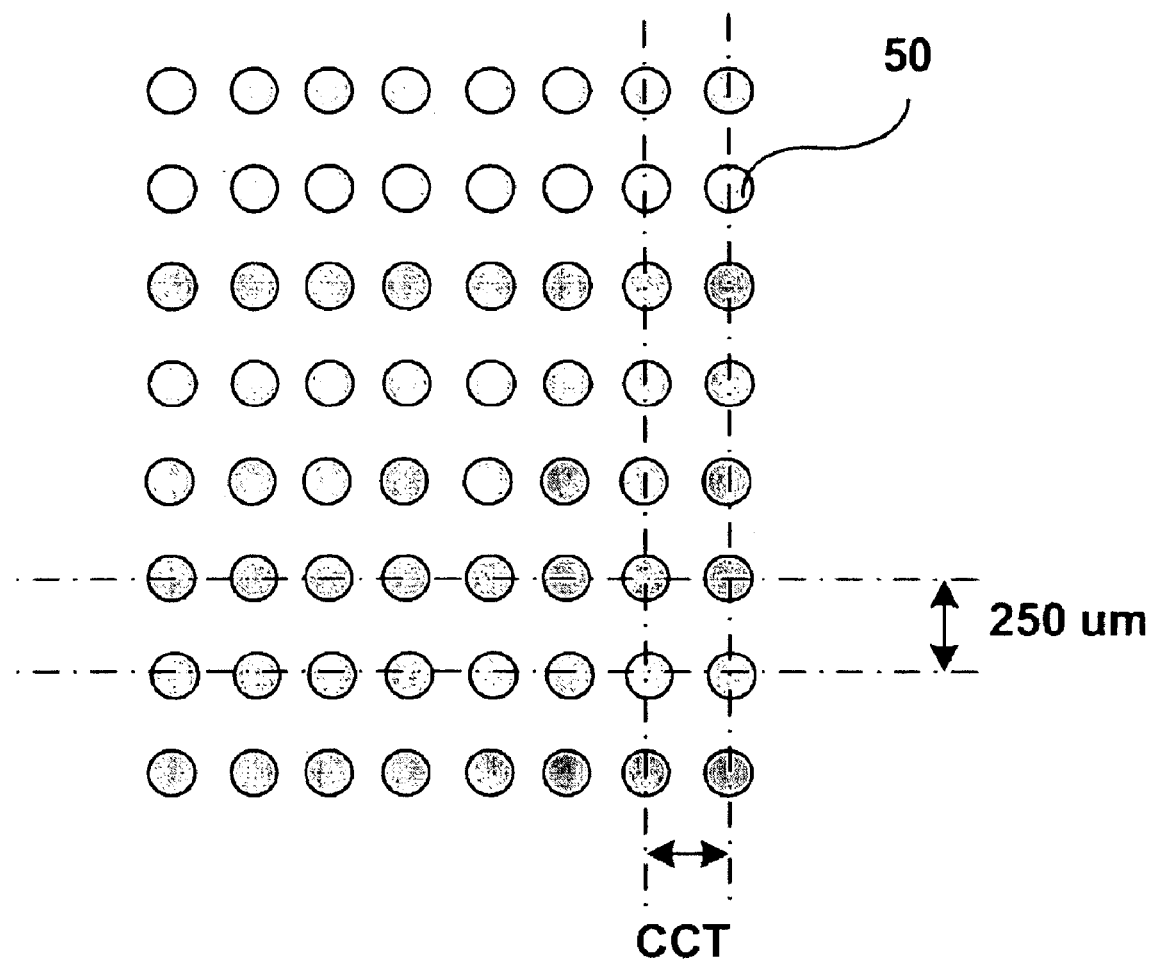

PRINTED CIRCUIT BOARD ASSEMBLY WITH MULTI-CHANNEL BLOCK-TYPE OPTICAL DEVICES PACKAGED THEREIN

BACKGROUND OF THE INVENTION

1. Field of the Invention

The present invention relates generally to a printed circuit board assembly with multi-channel block-type optical devices packaged therein, and more particularly to an optical printed circuit board assembly in which the optical printed circuit board is die-bonded to the top of a heat spreader, and optical devices are wire-bonded or flip-chip bonded to the top of the optical printed circuit board, such that multi-channel block-type optical devices are packaged in the form of an array, in an optical transmission system for respectively converting electrical and optical signals to optical and electrical signals and then transmitting them.

2. Description of the Prior Art

Generally, a Printed Circuit Board (PCB) is a circuit board fabricated by densely mounting a plurality of parts on a plate made of phenol resin or epoxy resin and densely forming curtailed circuits on the surface of the plate to connect the respective parts to each other. Such a PCB is manufactured by placing a conductive film, such as a copper film, on one surface of a phenol or epoxy resin insulation plate, etching required circuits on the copper film according to the wiring patterns of circuits (the copper film is then corroded away except for the line-shaped circuits), and forming holes to allow electrical parts to be mounted on the insulating plate.

PCBs are classified into single-sided PCBs, double-sided PCBs and multi-layer PCBs according to the number of wiring circuit surfaces. As the number of layers of a PCB increases, the ability to mount parts thereon increases greatly, so PCBs having many layers are applied to high precision products. A multi-layer PCB designates a PCB having three or more conductive patterns including a surface conductive pattern. The conductive patterns are attached to the respective layers of the PCB while being separated from each other by insulation materials between the respective layers.

On the other hand, in the prior art, circuit patterns are formed on a copper plate (through a patterning process) at the time of manufacturing a PCB to form inner and outer layers of the PCB. Recently, one or more optical waveguides capable of transmitting and receiving signals via light through the use of polymer materials and glass fibers are inserted into a base board, and a PCB containing the optical waveguides is called an Electro-Optical Circuit Board (EOCB). Such an EOCB is a PCB in which one or more optical waveguides and one or more glass plates are inserted into a base board on which copper circuit patterns are formed, so electrical and optical signals are used together, thus performing super high speed data communication in the same board through optical signal interfacing, and converting the optical signals into electrical signals in each mounted device so as to store data and process signals.

Currently, several coupling methods have been proposed for coupling optical signals between respective layers in a multi-layer PCB. Generally, a direct writing method, a beam reflection method, a method using a reflection mirror, and a direct coupling method are employed as methods of coupling optical signals between multi-channel layers.

Hereinafter, an example of an optical interface in a conventional PCB is described with reference to FIG. 1.

FIG. 1 shows a conventional beam coupling technology using a beam reflecting micro mirror.

Referring to FIG. 1, if an electrical signal is input from a processor board 2, the electrical signal is converted into an optical signal by a laser diode 1 in a transmission module 3 mounted on a PCB, and the optical signal is radiated. Thereafter, the radiated optical signal passes through lenses 8a and 8b on the left side of FIG. 1 and is reflected by a micro mirror 4a inserted into the PCB and depicted on the left side of FIG. 1. The reflected optical signal passes through an optical waveguide and is then reflected by a reflection mirror 4b on the right side of FIG. 1. Thereafter, the reflected optical signal is transmitted to a photodiode 6 in a reception module 7 through lenses 8c and 8d on the right side of FIG. 1. In the optical waveguide, the optical signal is transferred through its multi-mode polymer cores 5a and 5b with low loss. A waveguide cladding 9 is formed above and under the cores 5a and 5b. Consequently, an electrical signal transmitted from the processor board 2 on the left side of FIG. 1 is converted into an optical signal and transmitted. Thereafter, the optical signal is again converted into an electrical signal and then transmitted to a processor board on the right side of FIG. 1.

A conventional multi-layer PCB for coupling optical signals is described with reference to FIGS. 2a and 2b.

FIGS. 2a and 2b are front and side sectional views of the conventional multi-layer PCB for coupling optical signals, respectively. Referring to FIGS. 2a and 2b, the conventional multi-layer PCB employs a manner in which, if light is emitted from each Vertical-Cavity Surface-Emitting Laser (VCSEL) 13, that is, a optical device, a micro lens 17 concentrates the light and transmits the concentrated light to optical waveguide devices 14 and 15 through PCB optical via holes 16. At this time, signal coupling between respective layers is performed in the same manner as described above. In this case, a Silicon Optical Bench (SiOB) 12 is formed on a PCB 11, wherein the SiOB is a term generally designating silicon wafers. Instead of the SiOB 12, a polymer board can be used. The optical waveguide typically includes a cladding 14 and a core 15, and functions to transfer light received from the VCSEL 13 through the micro lens 17. Thereafter, an optical signal 19 is transferred to an optical waveguide of another layer. In this case, each of the optical via holes 16 is insulated with an insulation material 18. Further, a micro lens 17' can be inserted into each of the optical via holes 16 so as to more reliably transmit the optical signal.

The VCSEL 13 designates a light source used in an optical module that transmits and amplifies optical source data using a manner in which circular laser beams are emitted perpendicularly to the surface of a board. So far, Light Emitting Diodes (LEDs) and edge emitting Laser Diodes (LDs) have been generally used. However, Surface-Emitting Lasers (SELs) developed in the 1990s have been gaining popularity as light sources, replacing LEDs and edge emitting LDs. Such VCSELs are used in optical fiber communications, interfacing, large capacity information parallel processing, etc.

However, the conventional multi-layer PCB using the optical via holes 16 to transmit the optical signal 19 is problematic in that the micro lens 17 must be used, and the wavelength of an optical signal that can be transmitted through the conventional multi-layer PCB is limited to 200 μm. Additionally, a technique for inserting optical waveguides into the multiple layers of a multi-layer PCB has not been disclosed.

Further, in the prior art, optical waveguides are formed on only a single PCB layer, so a large number of optical waveguides must be formed on multiple layers and stacked together so as to transmit and receive large capacity data. Accordingly, the conventional PCB is problematic in that noise and high frequency characteristics due to heat emitted from VCSELs are not taken into account in the case where the VCSELs, which are optical devices, are packaged in an optical printed circuit board.

SUMMARY OF THE INVENTION

Accordingly, the present invention has been, made keeping in mind the above problems occurring in the prior art, and an object of the present invention is to provide a printed circuit board assembly with multi-channel block-type optical devices packaged therein, which uses a N×N block-type VCSEL array form, thus simultaneously transmitting and receiving wide band data through a single PCB.

Another object of the present invention provides a printed circuit board assembly with multi-channel block-type optical devices packaged therein, which can prevent alignment error and improve alignment characteristics of the printed circuit board through the insertion of fixing guides.

A further object of the present invention provides a printed circuit board assembly with multi-channel block-type optical devices packaged therein, which uses a VCSEL array for interconnection between multiple layers, so that a pitch between neighboring VCSELs can be varied to an arbitrary pitch value from a conventional pitch of 250 µm.

Still another object of the present invention provides a printed circuit board assembly with multi-channel block-type optical devices packaged therein, which is designed such that a heat spreader, such as a metal core, is inserted between a driving PCB and an optical signal transmitting/receiving PCB, thus obtaining a ground area and eliminating noise generated due to heat emitted from VCSELs.

Still another object of the present invention provides a printed circuit board assembly with multi-channel block-type optical devices packaged therein, which improves frequency characteristics for operating frequencies equal to or higher than 1.25 GHz through flip-chip packaging.

In order to accomplish the above objects, the present invention provides a printed circuit board assembly with optical devices packaged therein, comprising a plate type heat spreader; a driving printed circuit board die bonded to a top of the heat spreader to convert electrical and optical signals to optical and electrical signals, respectively; a driving integrated circuit, die bonded to the top of the heat spreader and wire bonded to the driving printed circuit board; an optical signal transmitting/receiving printed circuit board die bonded to a bottom of the heat spreader, with at least one waveguide for transmitting optical signals being arranged therein; at least one optical signal coupling block mounted on the optical signal transmitting/receiving printed circuit board; and optical devices die bonded to the bottom of the heat spreader and wire bonded to the optical signal transmitting/receiving printed circuit board to transfer optical signals to the optical signal coupling block.

Preferably, the printed circuit board assembly further may comprise at least one complementary type heat spreader arranged at an edge portion of the plate type heat spreader.

Preferably, the plate type heat spreader is a metal core with high heat transmissibility, and is used as a ground terminal.

Preferably, the driving integrated circuit may be one of a multiplexer and a demultiplexer for modulating and demodulating electrical signals and optical signals, respectively.

Preferably, the optical devices are Vertical-Cavity Surface-Emitting Lasers (VCSELs) or photo detectors, and are arranged in an array form that allows multi-channel optical signals to be simultaneously transmitted and received. Further, the optical devices are constructed such that a size of the optical signal coupling block is adjusted, and an array pitch between the optical devices for transferring optical signals to the optical signal coupling block is varied to correspond to the adjusted size of the optical signal coupling block.

Preferably, the optical signal coupling block is a fiber or pipe block.

Preferably, the optical devices may be constructed such that an array pitch between the optical devices is adjusted to be less than or equal to 250 µm.

Preferably, the printed circuit board assembly may further comprise at least one fixing guide attached to an edge portion of the plate type heat spreader to prevent alignment error when the printed circuit boards are attached to the plate type heat spreader.

Preferably, the printed circuit board assembly may further comprise alignment targets attached to predetermined positions of the optical devices and the optical signal transmitting/receiving printed circuit board to accurately arrange the optical devices.

Preferably, the plate type heat spreader includes a plurality of signal holes and ground holes formed therein.

Preferably, the plurality of signal holes are formed by previously forming larger holes, filling the larger holes with dielectric materials for insulation, forming conductive holes through center portions of the dielectric materials, and gilding the conductive holes, before the plate type heat spreader is attached to the printed circuit boards.

Preferably, the plurality of ground holes are formed by previously forming larger holes, filling the larger holes with conductive paste, forming conductive holes through center portions of the conductive paste, and gilding the conductive holes, before the plate type heat spreader is attached to the printed circuit boards.

In addition, the present invention provides a printed circuit board assembly with optical devices packaged therein, comprising a plate type heat spreader; a driving printed circuit board die bonded to a top of the heat spreader to convert electrical and optical signals to optical and electrical signals, respectively; a driving integrated circuit arranged on the driving printed circuit board and flip-chip bonded to the driving printed circuit board; an optical signal transmitting/receiving printed circuit board die bonded to a bottom of the heat spreader, with at least one waveguide for transferring optical signals being arranged therein; at least one optical signal coupling block mounted on the optical signal transmitting/receiving printed circuit board; and optical devices arranged on the optical signal transmitting/receiving printed circuit board and flip-chip bonded thereto to transfer optical signals to the optical signal coupling block.

Preferably, the flip-chip bonding of the optical devices is performed in a positive (+) manner in which electrodes of each optical device are arranged on a light emitting side of the optical device, or a negative (−) manner in which the electrodes of each optical device are arranged on a side of the optical device opposite to the light emitting side thereof.

Preferably, the positive (+) flip-chip bonding manner is implemented such that a cavity is formed in a pad on which each optical device is mounted, a material with a high light transmissibility is caused to fill the cavity, and the filling material is polished so as to allow the electrodes of each optical device to be arranged on the light emitting side of the optical device, thus obtaining straightness of light rays.

Preferably, the negative (−) flip-chip bonding manner is implemented such that each optical device and its electrodes are formed to be collinear with each other and be epitaxially grown so as to allow the electrodes of each optical device to be arranged on a side of the optical device opposite to the light emitting side of the optical device, thus enabling the optical devices to be surface mounted onto electrode pads to allow the light emitting side to be opposite to a side on which the electrode pads are arranged.

Consequently, in the printed circuit board assembly with the multi-channel block-type optical devices packaged therein according to the present invention, the driving printed circuit board and the optical signal transmitting/receiving printed circuit board are die bonded to a plate type heat spreader, and optical devices arranged in the form of an array are wire bonded or flip-chip bonded to the optical signal transmitting/receiving printed circuit board, thus easily transferring optical signals in a multi-layer optical printed circuit board.

BRIEF DESCRIPTION OF THE DRAWINGS

The above and other objects, features and other advantages of the present invention will be more clearly understood from the following detailed description taken in conjunction with the accompanying drawings, in which:

FIG. 1 is a view showing an example of an optical interface in the prior art;

FIGS. 7a and 7b are views showing pitches between arranged VCSELs according to the prior art and the present invention, respectively;

DESCRIPTION OF THE PREFERRED EMBODIMENTS

Figure 2A:
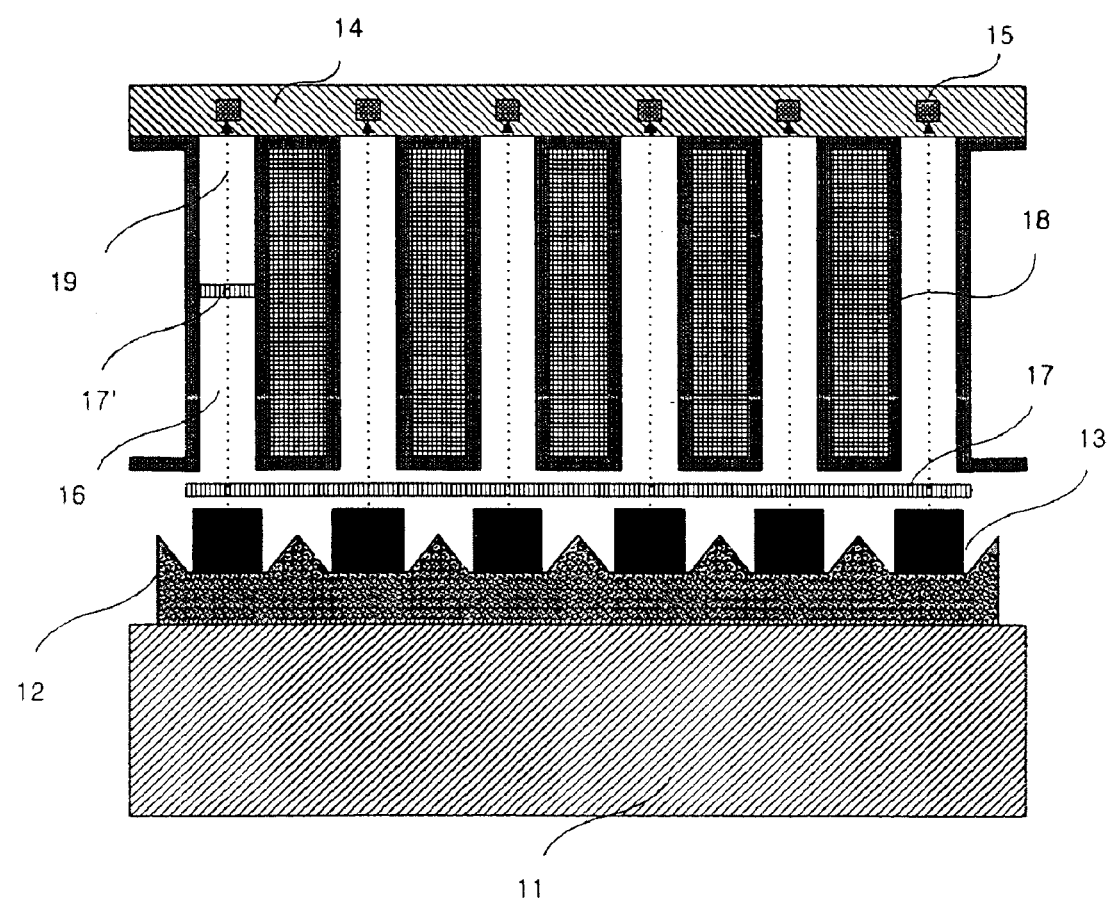
FIGS. 2a and 2b are front and side sectional views of a conventional multi-layer PCB for coupling optical signals with each other.
Figure 2B:
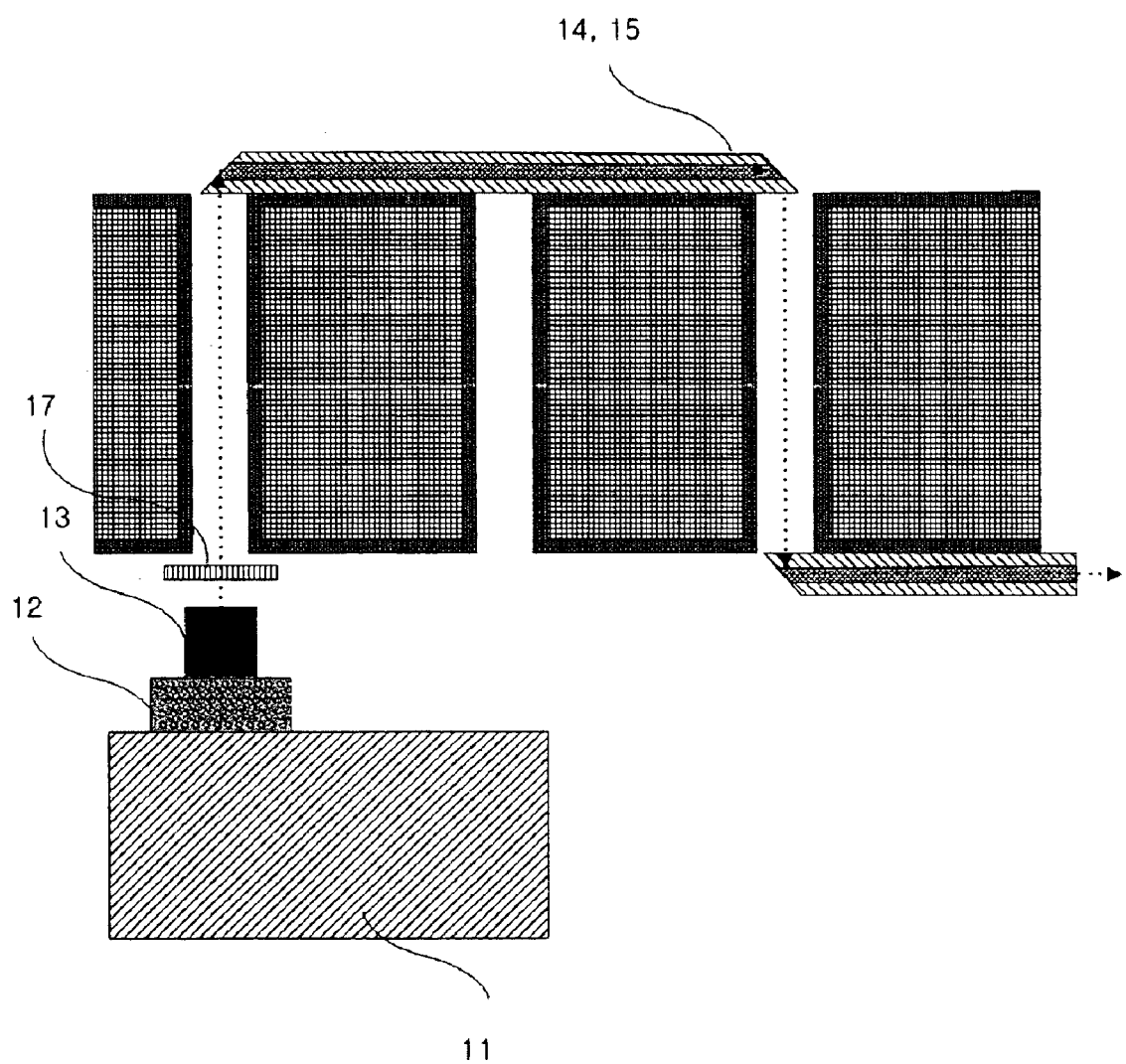

Reference now should be made to the drawings, in which the same reference numerals are used throughout the different drawings to designate the same or similar components.

A multi-layer PCB and method for coupling block-type multi-channel optical signals according to embodiments of the present invention is described with reference to the accompanying drawings.

First, a method for coupling optical signals between layers of the multi-layer PCB using optical signal coupling blocks according to the present invention is described.

Figure 3A:
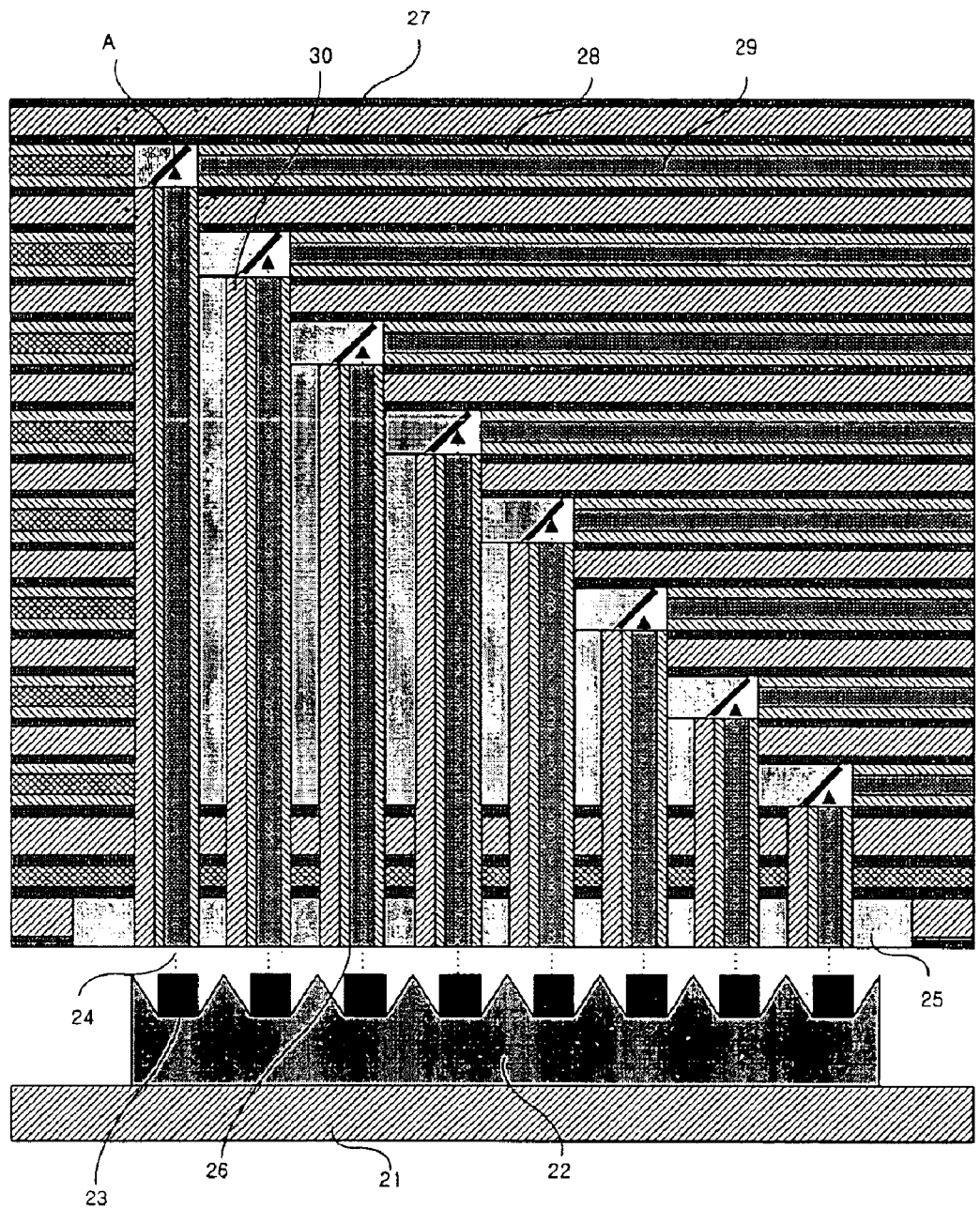
FIGS. 3a and 3b are front and side sectional views of a multi-layer PCB in which multi-channel optical signals of a multi-layer array type VCSEL are coupled together according to the present invention.
Figure 3B:
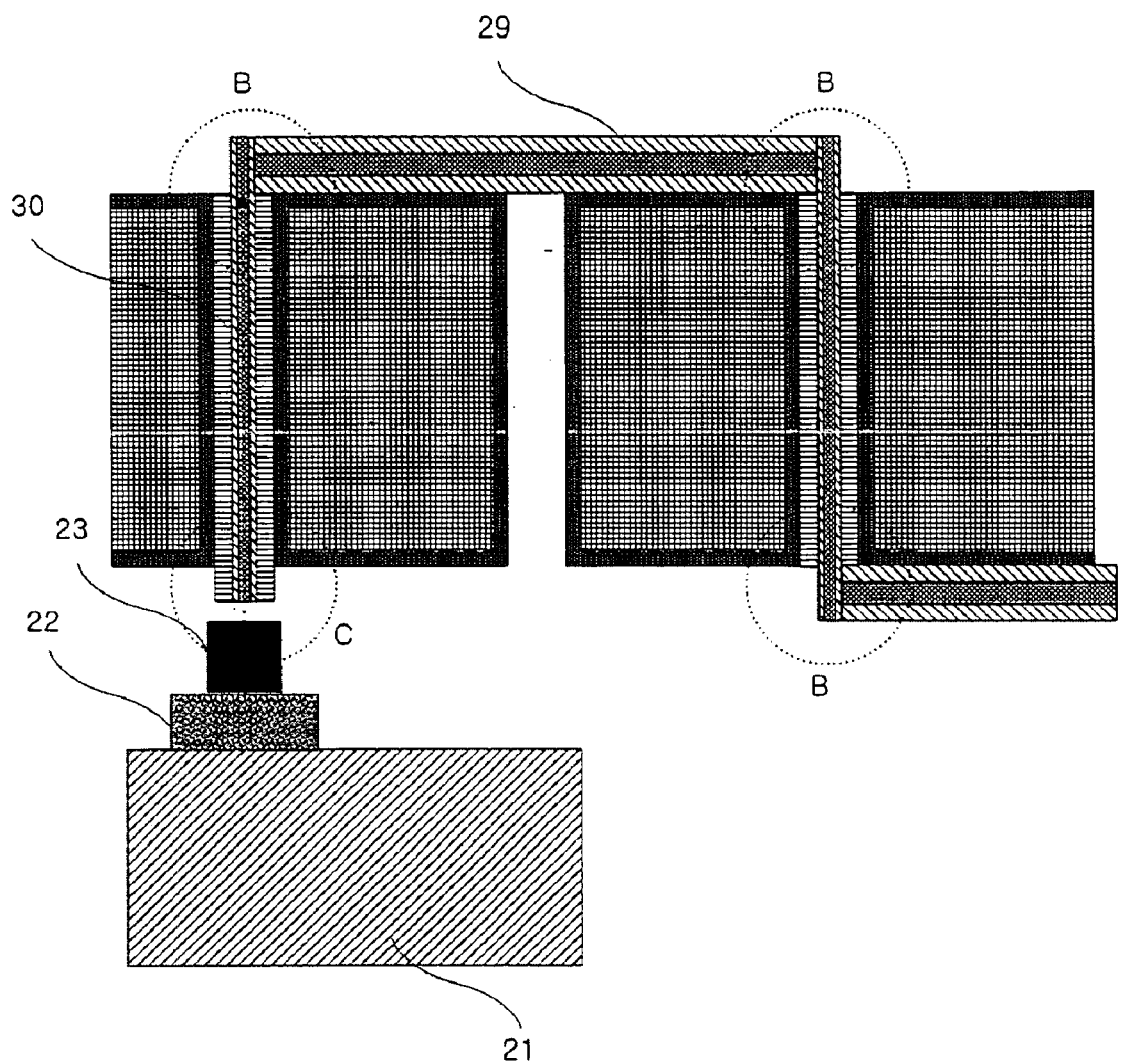

FIGS. 3a and 3b are front and side sectional views of a multi-layer PCB in which multi-channel optical signals of a multi-layer array type VCSEL are coupled together according to the present invention.

Referring to FIGS. 3a and 3b, the present invention employs a manner in which if light is emitted from VCSELs 23, that is, light sources, light is transmitted to optical waveguides 28 and 29 through the optical fibers 26 of fiber or pipe blocks 30 inserted into optical via holes. In this case, optical signal coupling between respective layers is also achieved in the same manner as described above. A SiOB 22 is formed on a PCB 21. The optical waveguides each typically consist of a cladding 28 and a core 29, and allow light transmitted from the VCSELs 23 to be transferred along the optical fibers 26 in the fiber blocks or pipe blocks 30. Thereafter, the optical signals 24 are transferred to optical waveguides of other layers.

Additionally, a plurality of optical via holes are formed in a multi-layer base board to form N×N block-type multi-channel optical waveguides, a plurality of fiber blocks each having a plurality of V-shaped grooves or pipe blocks 30 are inserted into the via holes using fixing guides 25 simultaneously or sequentially, and a plurality of optical waveguides 28 and 29 are interconnected to a plurality of optical fibers 26, thus interconnecting layers to each other. In this case, the term "N×N block-type multi-channel" means that N channels are formed in N layers". Since N channels are conventionally formed in a single channel, the term "1×N block-type multi-channel" has been used.

Therefore, the optical via holes are formed in the PCB, the fiber or the pipe blocks 40 are inserted into the optical via holes via the fixing guides, and the optical waveguides 28 and 29 are interconnected to the optical fibers 26 in respective layers, thus forming layers for coupling optical signals with each other in a built-up manner. Optical signals may be coupled by micro lenses A positioned between the optical waveguides and the fiber or pipe blocks 30.

FIG. 3b is a side cross-section of the multi-layer PCB of FIG. 3a. Optical signals are coupled together by connections illustrated in portions "B"s and "C". In this case, the portions "B" are portions in which the fiber or pipe blocks 30 are interconnected to the optical waveguides 29 by a beam reflection or direct writing coupling method, and the portion "C" is a portion in which the fiber or pipe block 30 is inserted into a base board to transmit light radiated from the VCSEL 23.

Meanwhile, the fiber blocks of the present invention are described in detail with reference to FIGS. 4a to 4c, and the pipe blocks thereof are described in detail with reference to FIG. 5.

Figure 4A:
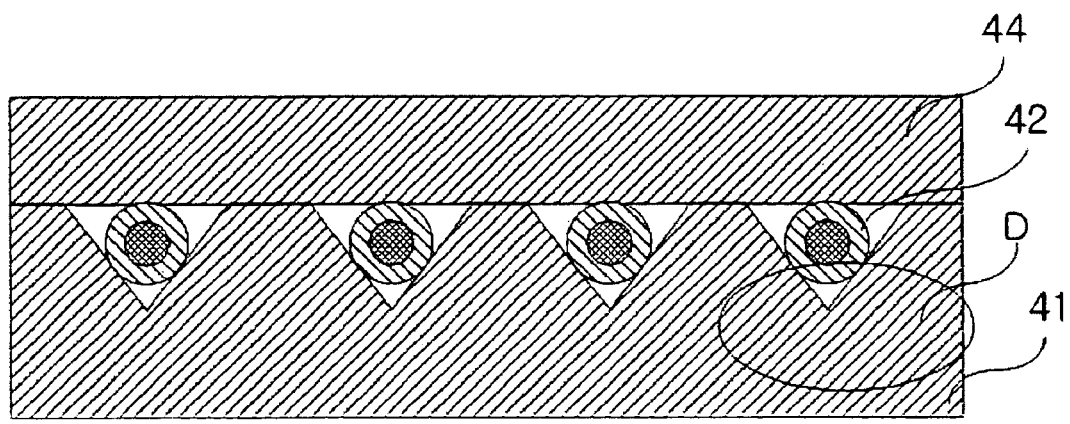
FIGS. 4a to 4c are cross-sections of various optical signal coupling fiber blocks each having V-shaped grooves.

FIG. 4a is a sectional view showing an optical signal coupling fiber block that has grooves of a certain shape in its lower portion but does not have grooves in its upper portion.

Figure 4B:
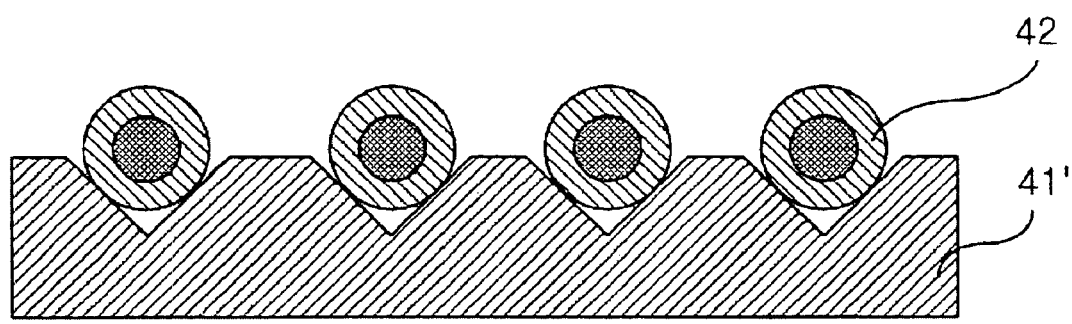

FIG. 4b is a sectional view showing a fiber block having V-shaped grooves in only its lower portion. FIG. 4c is a sectional view showing a fiber block having V-shaped grooves in both its lower and upper portions. The certain shape is preferably a "V" shape.

Referring to FIG. 4a, when the optical signal coupling fiber block according to the embodiment is interconnected to the optical waveguide to couple optical signals between layers in the multi-layer PCB, the optical signal coupling fiber block can be constructed by comprising a lower block 41 provided with a plurality of V-shaped grooves formed therein at regular intervals, optic fibers 42. inserted into the V-shaped grooves, and an upper block 44 placed on the optical fibers 42.

The lower block 41 is made of a silicon wafer or polymer, and the V-shaped grooves "D" can be formed by laser ion etching.

Further, glass fibers can be used as the optical fibers 42, which are preferably plastic optical fibers (POFs). On the other hand, the optical fibers 42 can be replaced with optical waveguides, which will be described in detail.

The upper block 44 is made of Pyrex glass having a light transmission rate equal to or greater than 95%, or polymer.

Figure 4C:
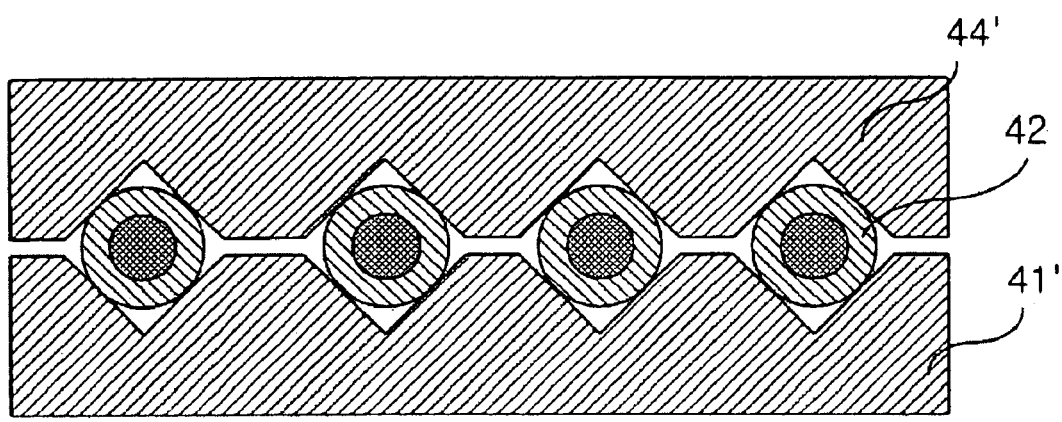

Further, referring to FIG. 4b, the fiber block can be formed using only a lower block 41' without an upper block shown in FIG. 4c.

Referring to FIG. 4c, an upper block 44' can be constructed such that grooves identical with the V-shaped grooves formed in the lower block 41' are formed therein.

Each of the optical fibers 42 is cut at an angle of either 45° or 90°, so it can be interconnected to the optical waveguide in an "L" or an inverted and reversed "L" shape.

Accordingly, in the fiber block of the present invention, the V-shaped grooves "D" are formed in the silicon (Si) wafer 41 to allow the optical fibers 42 to be inserted thereinto, so the fiber block functions as a medium for connecting the optical fibers 42 to the optical waveguide.

Figure 5:
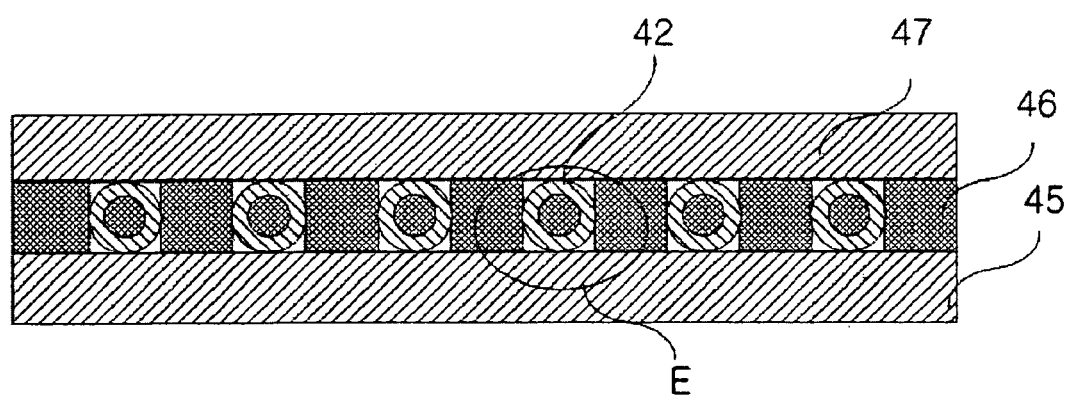
FIG. 5 is a cross-sectional view of an optical signal coupling pipe block.

FIG. 5 is a sectional view of an optical signal coupling pipe block.

Referring to FIG. 5, the optical signal coupling pipe block of the present invention is constructed by comprising an under-cladding 45 made of a medium for an optical waveguide, a core 46 defining a plurality of grooves formed in the shape of a pipe "E" at regular intervals on the under-cladding 45, a plurality of optical fibers 42 inserted into the plural grooves, and an over-cladding 47 formed on the optical fibers 42.

The core 46 is formed of polymer, and only functions as a guide without the transmission of light. That is, the core 46 is not a medium for transmitting light, but a guide for supporting the optical fibers 42 so as to guide light transmission. The core 46, the under-cladding 45 and the over-cladding 47 are laid upon each other to form the plural pipes "E". The optical fibers 42 are inserted into the pipe block.

In this case, the plural grooves can be formed through a laser ion etching process.

Further, the optical fibers 42 can be glass fibers, and are preferably plastic optical fibers (POFs).

The over-cladding 47 is made of Pyrex glass having a light transmission rate equal to or greater than 95%, or polymer material.

Each of the optical fibers 42 is cut at an angle of either 45° or 90°, so it can be connected to the optical waveguide in an "L" or an inverted and reversed "L" shape.

That is, in the optical signal coupling block of the present invention shown in FIGS. 4a to 4c and FIG. 5, "V" shaped grooves are formed in a polymer or Si wafer 41, with one end of each of the optical fibers 42 being cut at an angle of either 45° or 90° and with the other end thereof being cut at an angle of either 90° or 45°. Accordingly, the optical signal coupling fiber and pipe blocks are manufactured to be interconnected to the optical waveguide in an "L" or an inverted and reversed "L" shape, so they can be interconnected to allow different layers of the multi-layer PCB to freely exchange optical signals therebetween.

Hereinafter, the construction and operation of a printed circuit board assembly in which multi-channel block-type optical devices are packaged according to embodiments of the present invention is described with reference to FIGS. 6 to 12.

Figure 6:
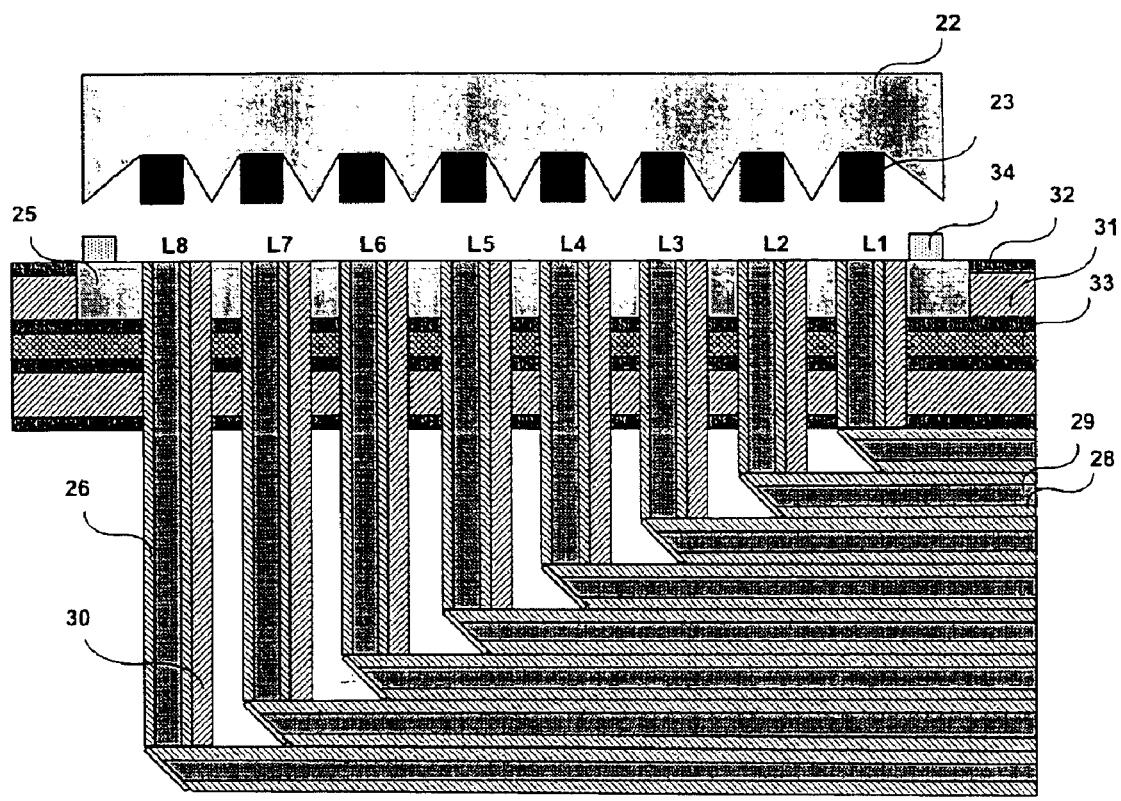
FIG. 6 is a front sectional view showing a multi-layer PCB in which multi-channel signals of a multi-layer VCSEL array are coupled using alignment targets according to the present invention.

FIG. 6 is a front sectional view showing a multi-layer PCB in which multi-channel optical signals of a multi-layer VCSEL are coupled using alignment targets according to the present invention.

As shown in FIG. 6, in order to couple multi-channel block-type optical signals, a plurality of optical via holes L1 to L8 are formed in the multi-layer PCB to allow optical signal coupling blocks to be inserted thereinto.

That is, the optical via holes L1 to L8, of a number corresponding to the number of optical signal coupling blocks 30 to insert, are formed in the PCB. Thereafter, after alignment targets 34 are formed on a fixing guide 25 and the PCB in advance, the fixing guide 25 is attached to the PCB. That is, the alignment targets 34 are attached to both the PCB and the fixing guide 25, and the positions of the respective layers are aligned, thus preventing alignment error from occurring. Such alignment targets are used in a typical PCB manufacturing process for the purpose of position alignment, and are marks formed on the fixing guide 25 and the PCB and referred to beforehand to lay out the multi-layer PCB.

The optical signal coupling blocks 30 and optical waveguides 28 and 29 are inserted into corresponding layers of the multi-layer PCB. In order to interconnect optical waveguides 28 and 29 and the optical signal coupling blocks 30 through optical signals at corresponding layers of the multi-layer PCB, they are aligned in their positions and interconnected. When the optical signal coupling blocks 30 and the optical waveguides 28 and 29 are interconnected, the optical waveguides 28 and 29 are joined to the optical signal coupling blocks 30 in ascending order from the shortest to longest. In this case, differences in the length of the optical signal coupling blocks L1 to L8 correspond to differences in the thickness of the optical waveguides. In this case, reference numeral 31 designates an internal insulating layer of a Copper Clad laminate (CCL), and 32 designates copper films formed in upper and lower portions of the insulating layer 31. Further, reference numeral 33 designates epoxy adhesive, used to adhere each CCL to another CCL.

Figure 7A:
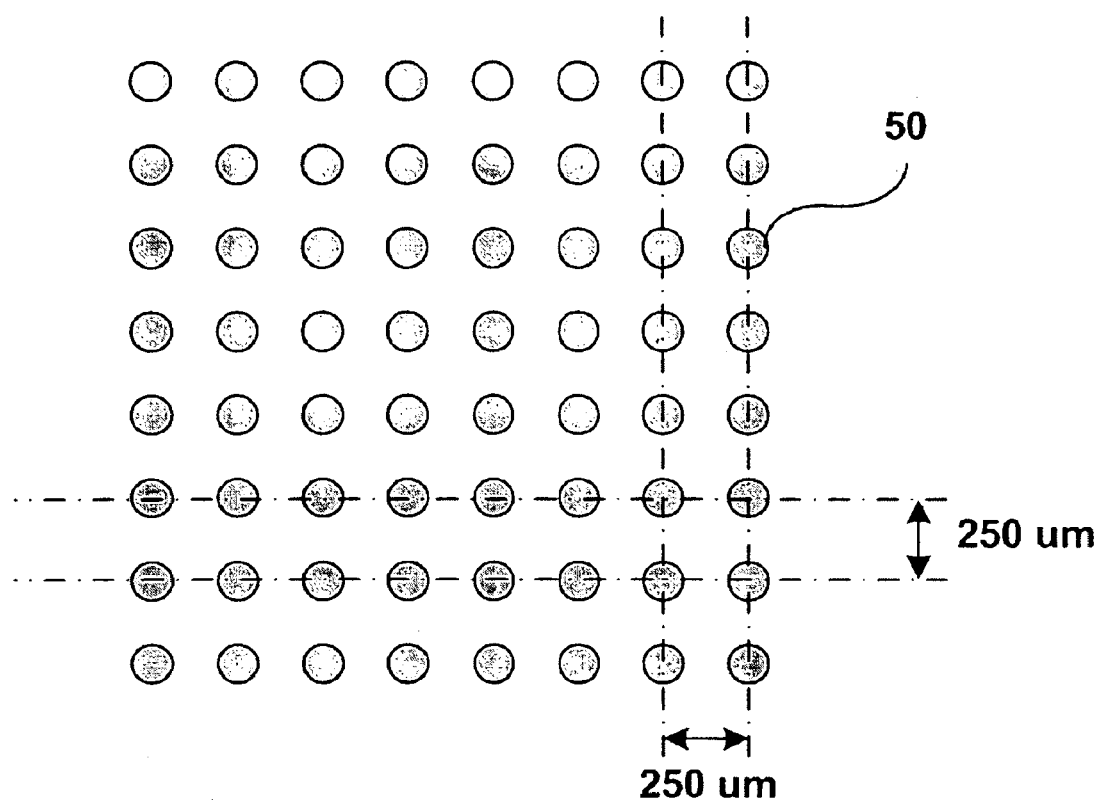

FIGS. 7a and 7b are views showing pitches between arranged VCSELs according to the prior art and the present invention, respectively. Referring to FIG. 7a, in the prior art, a pitch of the VCSEL array 50 is fixed to 250 μm. However, in the present invention, a center-to-center pitch (CCT) of neighboring cavities into which the fiber or pipe blocks are inserted can be adjusted to be less than 250 μm. That is, the fiber or pipe blocks are formed to decrease in size, and cavities corresponding to the fiber or pipe blocks are formed in the PCB, so the density of the PCB can be improved.

Meanwhile, in the optical PCB assembly of the present invention, light sources and photo detectors, which are optical devices, are arranged in the form of a N×N block array to transmit and receive optical signals to/from the optical signal coupling (fiber or pipe) blocks so as to couple N*N block-type optical signals between layers. In this case, parts for providing multi-channel optical signals are called light sources, and parts for receiving the optical signals from the light sources and detecting the optical signals are called photo detectors.

A typical 1×N channel is designed such that optical waveguides are formed on a single layer, while the present invention is designed such that the number of channels, that is, fiber or pipe blocks is increased, and a plurality of optical waveguides are formed in multiple layers to transmit and receive large capacity data. Moreover, a solution for the heat emitted from the VCSELs and the photo detectors (PDs) is required. Further, when the multi-layer PCB is designed, multi-channel N×N block-type light sources and photo detectors provided with solutions for noise and high frequency components due to the emitted heat-must be packaged.

First Embodiment

Hereinafter, a printed circuit board (PCB) assembly in which optical devices are packaged according to a first embodiment of the present invention is described in detail with reference to FIG. 8 and FIGS. 9a to 9c.

Figure 8:
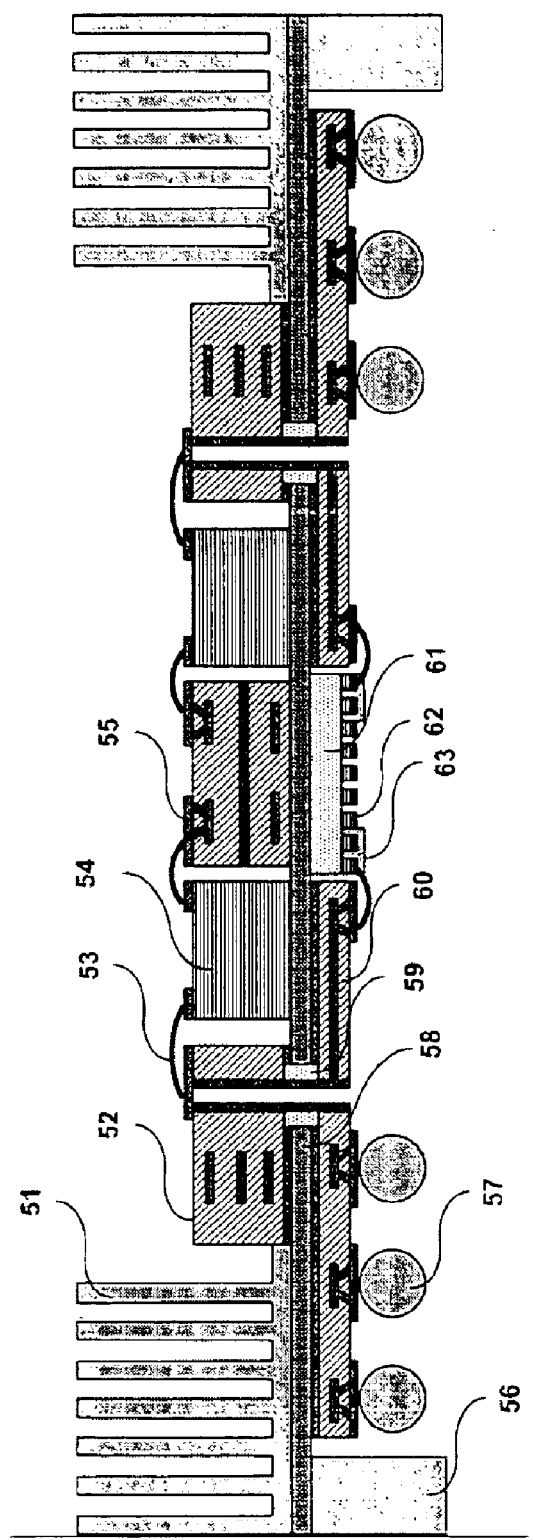
FIG. 8 is a cross-sectional view of a printed circuit board assembly in which wire bonded VCSELs are packaged according to the present invention.

FIG. 8 is a cross-sectional view of a printed circuit board assembly in which wire bonded VCSELs are packaged according to the present invention.

Referring to FIG. 8, the PCB assembly in which optical devices are packaged according to the first embodiment of the present invention is described. The left and right portions of FIG. 8 have the same construction, in which one of the two portions corresponds to a transmission unit and the other corresponds to a reception unit. Accordingly, since elements included in the transmission and reception units perform the same function, only the left portion is described for convenience of description.

First, a plate type heat spreader 58 is formed in the PCB assembly in which the optical devices are packaged, and a complementary type heat spreader 51 is arranged on an edge portion of the plate type heat spreader 58. The plate type heat spreader 58 may be a metal core with high heat transmissibility and is used as a ground terminal (GND). In this case, the complementary type heat spreader 51 is attached to a portion of the plate type heat spreader 58, not portions to which PCBs are attached.

Further, a driving printed circuit board 52 is die bonded to the top of the heat spreader 58 to convert electrical and optical signals into optical and electrical signals, respectively.

Further, a driving integrated circuit 54 is die bonded to the top of the heat spreader 58 and is wire bonded to the driving printed circuit board 52 through bonding wires 53. In this case, the driving integrated circuit 54 may be either a multiplexer or a demultiplexer for modulating or demodulating electrical and optical signals.

Further, an optical signal transmitting/receiving printed circuit board 60 is die bonded to the bottom of the heat spreader 58 and is provided with optical waveguides (not shown) arranged therein to transmit optical signals.

Further, optical signal coupling blocks are mounted on the optical signal transmitting/receiving printed circuit board 60. In this case, the optical signal coupling blocks are the above-described fiber or pipe blocks.

Moreover, an optical device array 61 is die bonded to the bottom of the heat spreader 58, and is wire bonded to the optical signal transmitting/receiving printed circuit board 60 to transfer optical signals to the optical signal coupling blocks. In this case, the optical device array 61 can be constructed by arranging VCSELs or photo detectors in the form of an array. Further, the sizes of the optical signal coupling blocks are adjusted, so a pitch of the optical device array 61 for transferring optical signals to the optical signal coupling blocks can be varied to correspond to the adjusted sizes of the optical signal coupling blocks, as described above.

Further, in order to prevent alignment error when the printed circuit boards are attached, a fixing guide 56 inserted into an edge portion of the plate-type heat spreader 58 can be included in the printed circuit board assembly. Further, in order to accurately arrange the optical device array 61, alignment targets 63, which are attached to predetermined positions of the optical device array 61 and the optical signal transmitting/receiving printed circuit board 60, can be additionally included in the printed circuit board assembly.

Therefore, in the printed circuit board having the above construction, electrical signals received from the outside are transferred through solder bumps 57, modulated in the driving integrated circuit 54, and transmitted to the VCSEL array 61. The transmitted electrical signals are converted into optical signals by the VCSEL array 61, which are transferred to the N×N block-type pipe and fiber blocks. After that, the optical signals are transferred to the photo detectors from the optical waveguides. The photo detectors transmit optical signals to a demodulation driving integrated circuit through conductive holes. The optical signals are converted into electrical signals by the demodulation driving integrated circuit, and the electrical signals are transferred to the PCB.

Figure 9A:
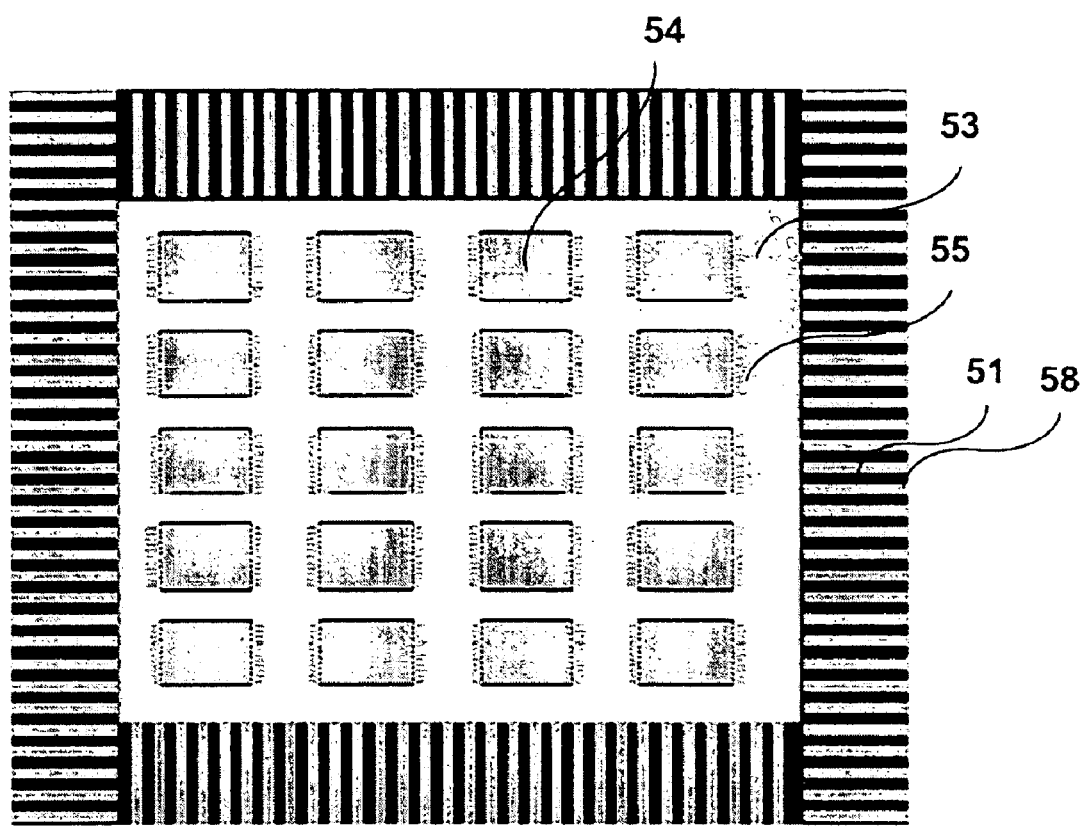
FIGS. 9a to 9c are top and bottom views of a wire bonded VCSEL array package, and a top view of a heat spreader, respectively, according to the present invention.
Figure 9B:
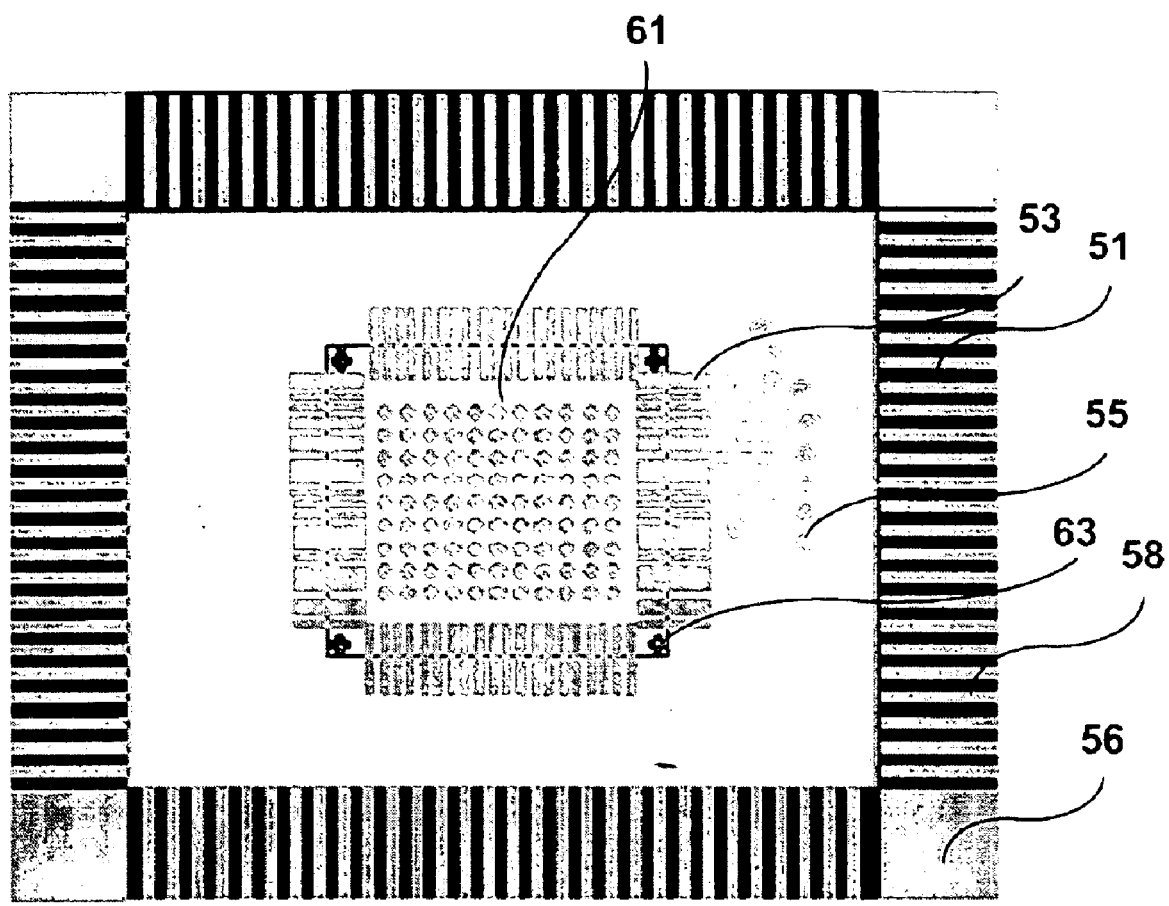
Figure 9C:
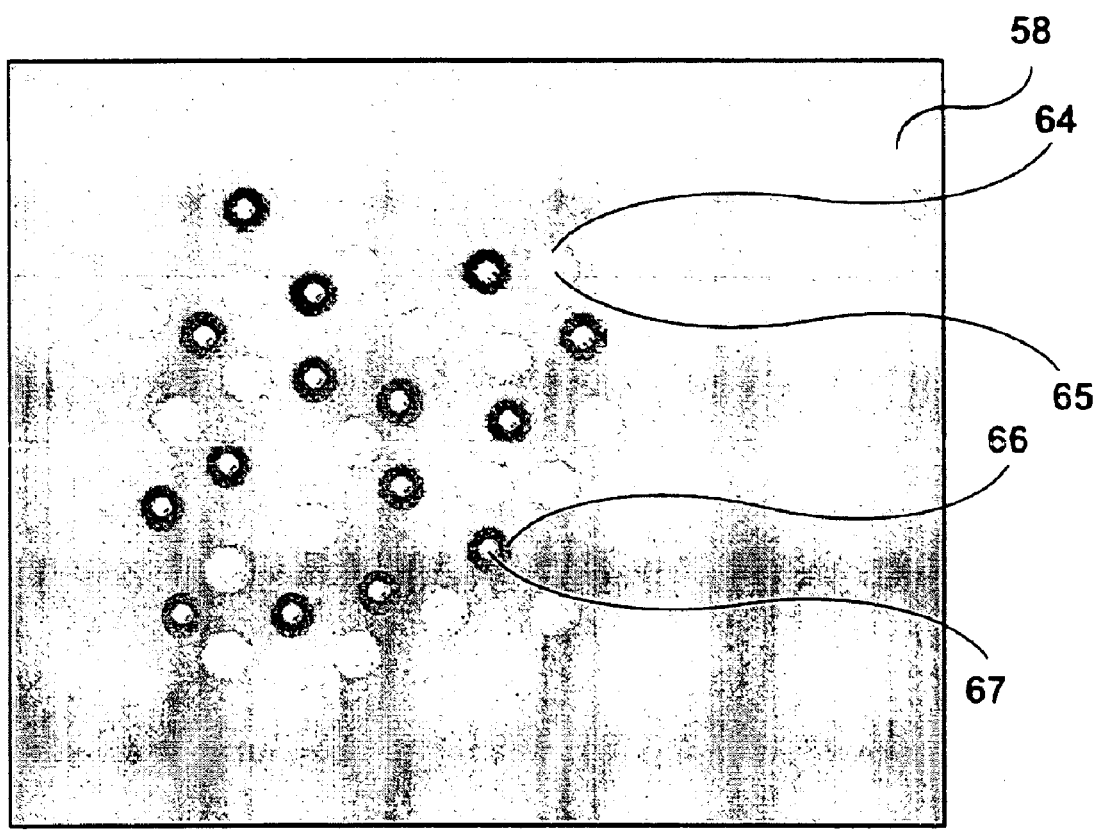

FIGS. 9a to 9c are top and bottom views of the wire bonded VCSEL array package, and a top view of a heat spreader, respectively, according to the present invention.

As shown in FIG. 9a, in the PCB assembly in which the optical devices are packaged according to the present invention, the complementary type heat spreader 51 is arranged on the edge portion of the plate type heat spreader 58, the plurality of the driving integrated circuits 54 are arranged on the plate type heat spreader 58, and a plurality of bonding wires 53 and via holes 55 for signal circuit patterns, which are connected to the driving integrated circuits 54, are formed over the plate-type heat spreader 58.

Further, as shown in FIG. 9b, in the PCB assembly in which the optical devices are packaged according to the present invention, the fixing guide 56 is formed on the edge of the heat spreader 58, and the VCSEL array 61 is die bonded to the bottom of the heat spreader 58. Further, alignment targets 63 are formed at four corners of the VCSEL array 61. Similar to the driving integrated circuits 54, the VCSEL array 61 is wire bonded to transmit optical signals through the signal circuit pattern via holes 55.

Referring to FIG. 9c, in the plate type heat spreader 58, a plurality of signal holes 64 and ground holes 66 are formed. The signal holes 64 are formed by previously forming larger holes, filling the larger holes with dielectric materials for insulation, forming conductive holes 65 through the center portions of the dielectric materials, and gilding the conductive holes 65, before the heat spreader 58 is attached to printed circuit boards. Further, the ground holes 66 are formed by previously forming larger holes, filling the larger holes with conductive paste, forming conductive holes 67 through the center portion of the conductive paste, and gilding the conductive holes 67, before the heat spreader 58 is attached to the printed circuit boards.

Second Embodiment

Hereinafter, a printed circuit board assembly in which optical devices are packaged according to a second embodiment of the present invention is described in detail with reference to FIGS. 10 to 12b.

Figure 10:
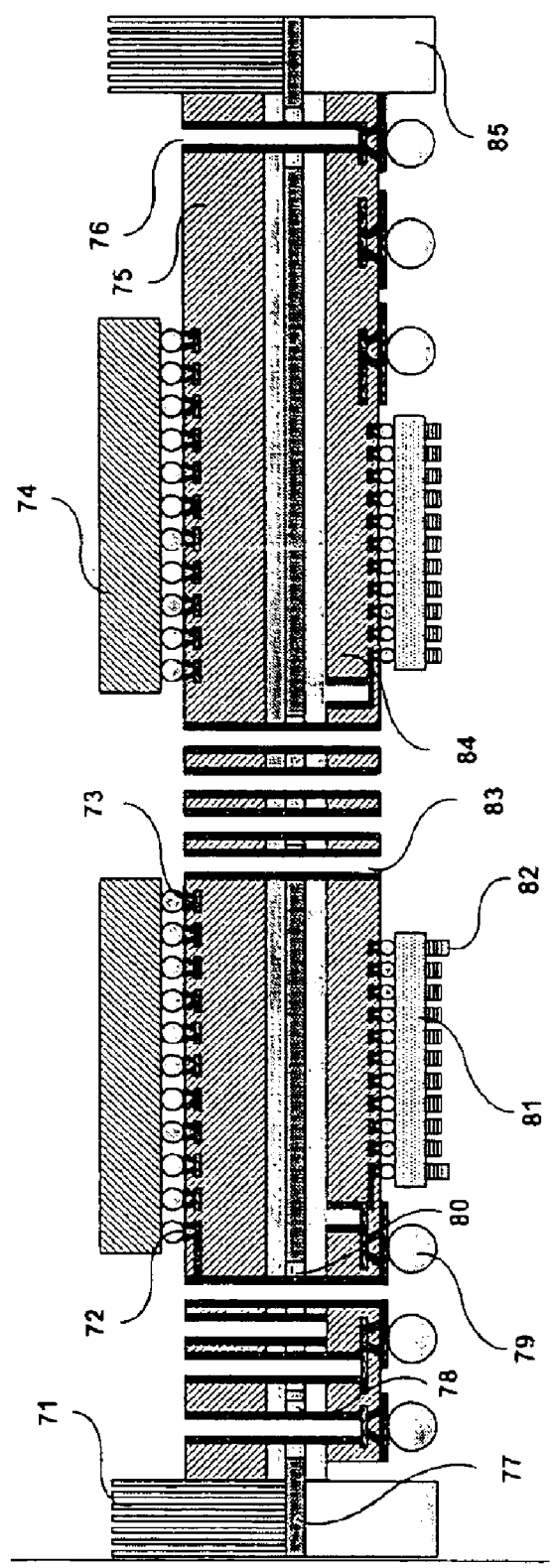
FIG. 10 is a cross-sectional view of a printed circuit board assembly in which flip-chip bonded VCSELs are packaged according to the present invention.

FIG. 10 is a sectional view of a printed circuit board assembly in which flip-chip bonded VCSELs are packaged according to the present invention.

Referring to FIG. 10, the printed circuit board assembly in which the optical devices are packaged according to the second embodiment of the present invention comprises a complementary type heat spreader 71, flip-chip bonding solder bumps 72, blind via holes 73, a modulation and demodulation driving integrated circuit 74, conductive holes 76 which are signal via holes, a plate type heat spreader 77, solder balls 79, conductive paste 80, insulating dielectric materials 78, a VCSEL array 81, ground conductive holes 83, alignment targets 82, an optical signal transmitting/receiving printed circuit board 84, a driving printed circuit board 75, and a fixing guide 85. Only a difference between the first and second embodiments is described, and the description for elements the same as those of the first embodiment is omitted.

In the printed circuit board assembly in which the optical devices are packaged according to the second embodiment of the present invention, the driving integrated circuit 74 is arranged on the driving printed circuit board 75 to be flip-chip bonded thereto. Further, the optical device array 81 is arranged on the optical signal transmitting/receiving printed circuit board 84 to be flip-chip bonded thereto, thus transmitting optical signals to optical signal coupling blocks. That is, in the first embodiment, the driving integrated circuit 54 and the optical device array 61 are directly die bonded onto the heat spreader 58, and are wire bonded onto their respective PCBs using bonding wires 53. However, in the second embodiment, the driving integrated circuit 74 and the optical device array 81 are flip-chip bonded to respective printed circuit boards using flip-chip bonding solder bumps 72. For these operations, the driving integrated circuit 74 or the optical device array 81 is flip-chip bonded to the respective PCBs via the plural micro via holes 73.

The reason for flip-chip bonding the driving integrated circuit 74 and the optical device array 81 is that all signals are transmitted on the PCB and chips are mounted using a flip-chip bonding method to prevent noise due to high frequency signals.

Further, in the plate type heat spreader 77, a plurality of signal holes 76 and ground holes 83 are formed. The signal holes 76 are formed by previously forming larger holes, filling the larger holes with dielectric materials 80 for insulation, and forming conductive holes through the center portions of the dielectric materials 80, before the heat spreader 77 is attached to printed circuit boards. Further, the ground holes 83 are formed by previously forming larger holes, filling the larger holes with conductive paste 78, and forming conductive holes through the center portions of the conductive paste 78, before the heat spreader 77 is attached to the printed circuit boards.

Figure 11A:
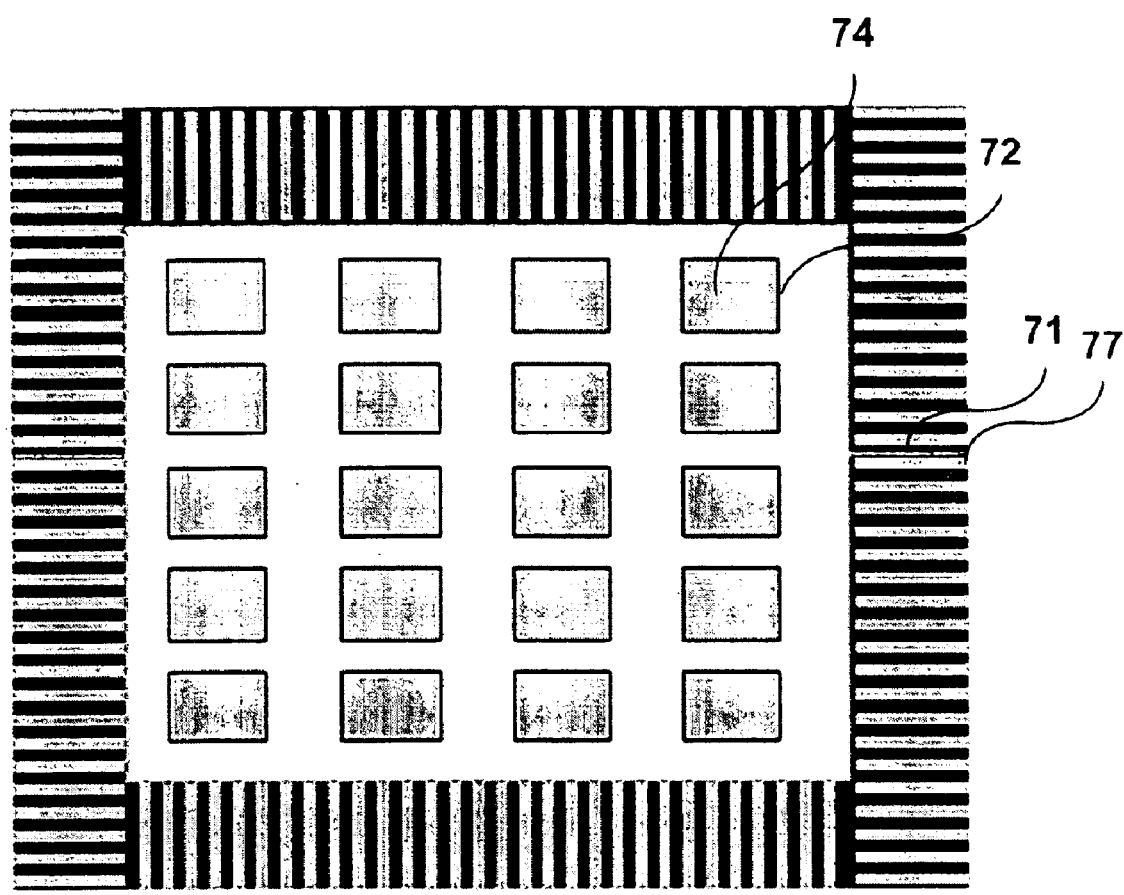
FIGS. 11a and 11b are top and bottom views of a flip-chip bonded VCSEL array package, respectively, according to the present invention.
Figure 11B:
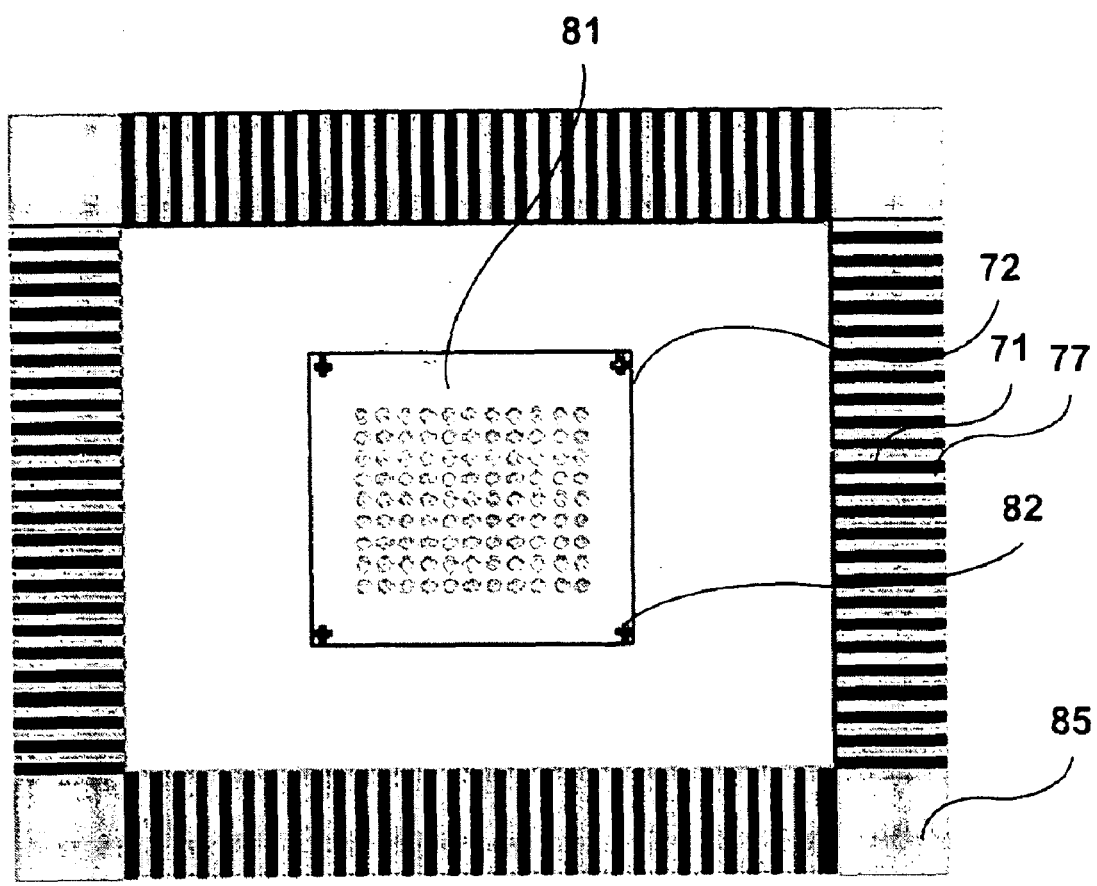

FIGS. 11a and 11b are top and bottom views of the flip-chip bonded VCSEL array package according to the present invention.

As shown in FIG. 11a, in the printed circuit board assembly in which the optical devices are packaged according to the second embodiment of the present invention, the complementary type heat spreader 71 is arranged on the edge portion of the plate type heat spreader 77, the plurality of driving integrated circuits 74 are arranged on the plate type heat spreader 77, and the flip-chip bonding solder bumps 72, connected to the driving integrated circuits 74, are formed on the plate type heat spreader 77.

Further, as shown in FIG. 11b, in the printed circuit board assembly in which the optical devices are packaged according to the second embodiment of the present invention, the fixing guide 85 is formed on the edge portion of the heat spreader 77, and the VCSEL array 81 is flip-chip bonded to the bottom of the heat spreader 77. Further, alignment targets 82 are formed at four corners of the VCSEL array 81. Similar to the driving integrated circuits 74, the VCSEL array 81 is flip-chip bonded using the solder bumps 72.

Figure 12A:
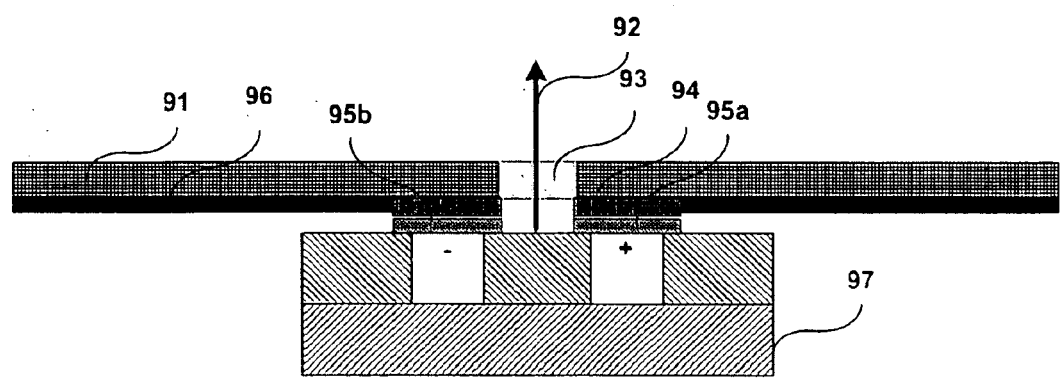
FIGS. 12a and 12b are views showing a structure in which the flip-chip bonded VCSEL is packaged in the printed circuit board assembly.
Figure 12B:
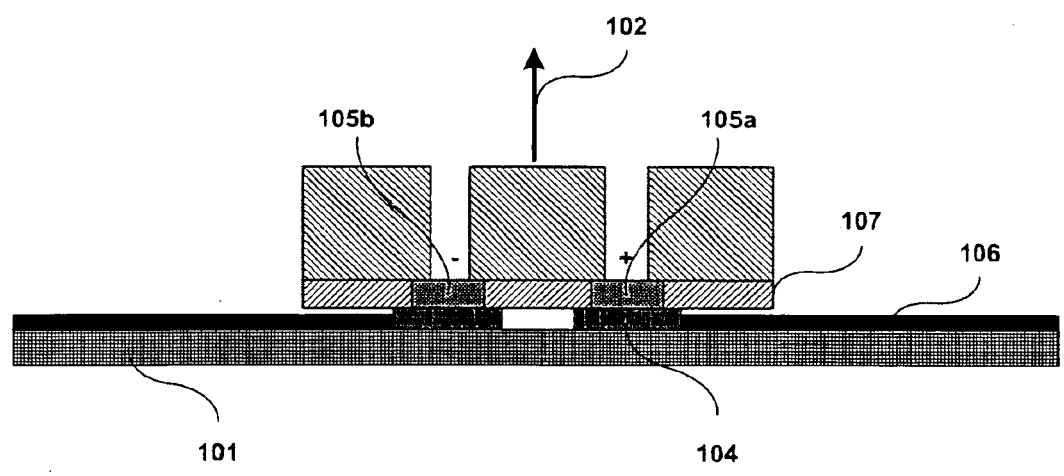

FIGS. 12a and 12b are views showing a structure in which the flip-chip bonded VCSEL is packaged in the printed circuit board assembly.

The flip-chip bonding methods are classified into two types: a positive (+) type in which electrodes of an optical device (VCSEL) are arranged on a light emitting side of the optical device, and a negative (−) type in which the electrodes of the optical device are arranged on a side of the optical device opposite to the light emitting side thereof.

Referring to FIG. 12a, the positive (+) flip-chip bonding manner is implemented such that a cavity 93 is formed in a pad 94 on which an optical device 97 is mounted, a material with a high light transmissibility is caused to fill the cavity, the filling material is polished and a surface illumination/smoothness is increased so as to allow electrodes 95a and 95b of the optical device 97 to be arranged on the light emitting side 92 of the optical device 97, thus obtaining straightness of light rays. In this case, reference numeral 91 designates a printed circuit board having a thickness less than or equal to 0.1 T, and 96 designates a pattern for signal transmission.

Referring to FIG. 12b, the negative (−) flip-chip bonding manner is implemented such that an optical device 107 and its electrodes 105a and 105b are formed to be collinear with each other and to be epitaxially grown so as to allow the electrodes 105a and 105b of the optical device 107 to be arranged on a side of the optical device opposite to a light emitting side 102 of the optical device 107. Further, the optical device 107 is surface mounted onto electrode pads 104 such that the light emitting side 102 is opposite to a side on which the electrode pads 104 are arranged.

Although the printed circuit board assembly in which multi-channel block-type optical devices are packaged according to the first and second embodiments of the present invention has been shown and described, those skilled in the art will appreciate that various modifications, additions and substitutions are possible.

As apparent from the above description, the present invention provides a printed circuit board assembly in which multi-channel block-type optical devices are packaged, which uses a N×N block-type VCSEL array form, thus simultaneously transmitting and receiving wide band data through a single PCB.

Further, the present invention is advantageous in that it can prevent alignment error and improve alignment characteristics of the printed circuit board through the insertion of fixing guides.

Further, the present invention is advantageous in that it uses a VCSEL array for interconnection between multiple layers, so that a pitch between neighboring VCSELs can be varied to an arbitrary pitch value from a conventional pitch of 250 μm.

Further, the present invention is advantageous in that a heat spreader, such as a metal core, is inserted between a driving PCB and an optical signal transmitting/receiving PCB, thus obtaining a ground area and eliminating noise generated due to heat emitted from VCSELs.

Moreover, the present invention is advantageous in that it can improve frequency characteristics for operating frequencies equal to or higher than 1.25 GHz through flip-chip packaging.

What is claimed is:

1. A printed circuit board assembly with optical devices packaged therein, comprising:
    a plate type heat spreader;
    a driving printed circuit board bonded to a top of the heat spreader to convert electrical and optical signals to optical and electrical signals, respectively;
    a driving integrated circuit bonded to the top of the heat spreader and wire bonded to the driving printed circuit board;
    an optical signal transmitting/receiving printed circuit board bonded to a bottom of the heat spreader, with at least one waveguide for transmitting optical signals being arranged therein;
    at least one optical signal coupling block mounted on the optical signal transmitting/receiving printed circuit board; and
    optical devices bonded to the bottom of the heat spreader and wire bonded to the optical signal transmitting/receiving printed circuit board to transfer optical signals to the optical signal coupling block.

2. The printed circuit board assembly according to claim 1, further comprising at least one complementary type heat spreader arranged at an edge portion of the plate type heat spreader.

3. The printed circuit board assembly according to claim 1, wherein the plate type heat spreader is a metal core with high heat transmissibility.

4. The printed circuit board assembly according to claim 1, wherein the plate type heat spreader is used as a ground terminal.

5. The printed circuit board assembly according to claim 1, wherein the driving integrated circuit is one of a multiplexer and a demultiplexer for modulating and demodulating electrical signals and optical signals, respectively.

6. The printed circuit board assembly according to claim 1, wherein the optical devices are Vertical-Cavity Surface-Emitting Lasers (VCSELs) or photo detectors.

7. The printed circuit board assembly according to claim 1, wherein the optical devices are arranged in an array form that allows multi-channel optical signals to be simultaneously transmitted and received.

8. The printed circuit board assembly according to claim 7, wherein the optical devices are constructed such that a size of the optical signal coupling block is adjusted, and an array pitch between the optical devices for transferring optical signals to the optical signal coupling block is varied to correspond to the adjusted size of the optical signal coupling block.

9. The printed circuit board assembly according to claim 1, wherein the optical signal coupling block is a fiber or pipe block.

10. The printed circuit board assembly according to claim 1, wherein the optical devices are constructed such that an array pitch between the optical devices is adjusted to be less than or equal to 250 $\mu$m.

11. The printed circuit board assembly according to claim 1, further comprising at least one fixing guide attached to an edge portion of the plate type heat spreader to prevent alignment error when the printed circuit boards are attached to the plate type heat spreader.

12. The printed circuit board assembly according to claim 1, further comprising alignment targets attached to predetermined positions of the optical devices and the optical signal transmitting/receiving printed circuit board to accurately arrange the optical devices.

13. The printed circuit board assembly according to claim 1, wherein the plate type heat spreader includes a plurality of signal holes and ground holes formed therein.

14. The printed circuit board assembly according to claim 13, wherein the plurality of signal holes are formed by previously forming larger holes, filling the larger holes with dielectric materials for insulation, forming conductive holes through center portions of the dielectric materials, and gilding the conductive holes, before the plate type heat spreader is attached to the printed circuit boards.

15. The printed circuit board assembly according to claim 13, wherein the plurality of ground holes are formed by previously forming larger holes, filling the larger holes with conductive paste, forming conductive holes through center portions of the conductive paste, and gilding the conductive holes, before the plate type heat spreader is attached to the printed circuit boards.

16. A printed circuit board assembly with optical devices packaged therein, comprising:
    a plate type heat spreader;
    a driving printed circuit board bonded to a top of the heat spreader to convert electrical and optical signals to optical and electrical signals, respectively;
    a driving integrated circuit arranged on the driving printed circuit board and flip-chip bonded to the driving printed circuit board;
    an optical signal transmitting/receiving printed circuit board bonded to a bottom of the heat spreader, with at least one waveguide for transferring optical signals being arranged therein;
    at least one optical signal coupling block mounted on the optical signal transmitting/receiving printed circuit board; and
    optical devices arranged on the optical signal transmitting/receiving printed circuit board and flip-chip bonded thereto to transfer optical signals to the optical signal coupling block.

17. The printed circuit board assembly according to claim 16, further comprising at least one complementary type heat spreader arranged at an edge portion of the plate type heat spreader.

18. The printed circuit board assembly according to claim 16, wherein the plate type heat spreader is a metal core with high heat transmissibility.

19. The printed circuit board assembly according to claim 16, wherein the plate type heat spreader is used as a ground terminal.

20. The printed circuit board assembly according to claim 16, wherein the driving integrated circuit is one of a multiplexer and a demultiplexer for modulating and demodulating electrical signals and optical signals, respectively.

21. The printed circuit board assembly according to claim 16, wherein the optical devices are Vertical-Cavity Surface-Emitting Lasers (VCSELs) or photo detectors.

22. The printed circuit board assembly according to claim 16, wherein the optical devices are arranged in an array form that allows multi-channel optical signals to be simultaneously transmitted and received.

23. The printed circuit board assembly according to claim 22, wherein the optical devices are constructed such that a size of the optical signal coupling block is adjusted, and an array pitch between the optical devices for transferring optical signals to the optical signal coupling block is varied to correspond to the adjusted size of the optical signal coupling block.

24. The printed circuit board assembly according to claim 16, wherein the optical signal coupling block is a fiber or pipe block.

25. The printed circuit board assembly according to claim 16, wherein the optical devices are constructed such that an array pitch between the optical devices is adjusted to be less than or equal to 250 $\mu$m.

26. The printed circuit board assembly according to claim 16, further comprising at least one fixing guide attached to an edge portion of the plate type heat spreader to prevent alignment error when the printed circuit boards are attached to the plate type heat spreader.

27. The printed circuit board assembly according to claim 16, further comprising alignment targets attached to predetermined positions of the optical devices and the optical signal transmitting/receiving printed circuit board to accurately arrange the optical devices.

28. The printed circuit board assembly according to claim 16, wherein the plate type heat spreader includes a plurality of signal holes and ground holes formed therein.

29. The printed circuit board assembly according to claim 28, wherein the plurality of signal holes are formed by previously forming larger holes, filling the larger holes with dielectric materials for insulation, forming conductive holes through center portions of the dielectric materials, and gilding the conductive holes, before the plate type heat spreader is attached to the printed circuit boards.

30. The printed circuit board assembly according to claim 28, wherein the plurality of ground holes are formed by previously forming larger holes, filling the larger holes with conductive paste, forming conductive holes through center portions of the conductive paste, and gilding the conductive holes, before the plate type heat spreader is attached to the printed circuit boards.

31. The printed circuit board assembly according to claim 16, wherein the flip-chip bonding of the optical devices is performed in a positive (+) manner in which electrodes of each optical device are arranged on a light emitting side of the optical device, or a negative (−) manner in which the electrodes of each optical device are arranged on a side of the optical device opposite to the light emitting side thereof.

32. The printed circuit board assembly according to claim 31, wherein the positive (+) flip-chip bonding manner is implemented such that a cavity is formed in a pad on which each optical device is mounted, a material with a high light transmissibility is caused to fill the cavity, and the filling material is polished so as to allow the electrodes of each optical device to be arranged on the light emitting side of the optical device, thus obtaining straightness of light rays.

33. The printed circuit board assembly according to claim 31, wherein the negative (−) flip-chip bonding manner is implemented such that each optical device and its electrodes are formed to be collinear with each other and be epitaxially grown so as to allow the electrodes of each optical device to be arranged on a side of the optical device opposite to the light emitting side of the optical device, thus enabling the optical devices to be surface mounted onto electrode pads to allow the light emitting side to be opposite to a side on which the electrode pads are arranged.

* * * * *